United States Patent [19]

Karl et al.

[11] Patent Number: 5,027,995
[45] Date of Patent: Jul. 2, 1991

[54] PROCESS FOR BONDING SEMICONDUCTOR CHIPS TO SUBSTRATES

[75] Inventors: Alois Karl, Saal a.d. Donau; Karl Osojnik, Munich; Werner Spaeth, Holzkirchen; Guenther Waitl, Regensburg, all of Fed. Rep. of Germany

[73] Assignee: Siemens Aktiengesellschaft, Berlin and Munich, Fed. Rep. of Germany

[21] Appl. No.: 657,292

[22] Filed: Feb. 19, 1991

Related U.S. Application Data

[63] Continuation of Ser. No. 400,259, Aug. 29, 1989, abandoned.

[30] Foreign Application Priority Data

Aug. 31, 1988 [DE] Fed. Rep. of Germany ....... 3829538

[51] Int. Cl.$^5$ ..................... B23K 20/00; B23K 20/10; H05K 3/32; H01L 21/58
[52] U.S. Cl. .................................. 228/111; 228/116; 228/180.2
[58] Field of Search ............... 228/110, 111, 115, 116, 228/123, 180.2, 254; 357/70

[56] References Cited

U.S. PATENT DOCUMENTS

| | | | |
|---|---|---|---|
| 3,838,984 | 10/1974 | Crane et al. | 228/180.2 |
| 4,607,779 | 8/1986 | Burns | 228/180.2 |
| 4,693,770 | 9/1987 | Hatada | 228/180.2 |
| 4,754,912 | 7/1988 | Burns | 357/70 |
| 4,784,972 | 11/1988 | Hatada | 228/180.2 |
| 4,857,671 | 8/1989 | Nakano et al. | 228/180.2 |
| 4,887,760 | 12/1989 | Yoshino et al. | 228/180.2 |

FOREIGN PATENT DOCUMENTS

| | | |
|---|---|---|
| 3025859 | 1/1982 | Fed. Rep. of Germany . |
| 3209242 | 11/1982 | Fed. Rep. of Germany . |
| 3531235 | 4/1986 | Fed. Rep. of Germany . |
| 19652 | 2/1979 | Japan ................................. 228/180.2 |
| 287138 | 12/1986 | Japan ................................. 228/180.2 |

OTHER PUBLICATIONS

Elektronik Produktion & Pruftechnik, Oct. 1987, p. 140.
Patent Abstracts of Japan, E-581, vol. 12, No. 44, JP-6-2-195137, Feb. 9, 1988.
Patent Abstracts of Japan, E-320, vol. 9, No. 136, JP-6-0-20536, Jun. 12, 1985.
Patent Abstracts of Japan, E566, vol. 11, No. 387, JP-6-2-152143, Dec. 17, 1987.
Patent Abstracts of Japan, E567, vol. 11, No. 390, JP-6-2-154648, Dec. 19, 1987.

*Primary Examiner*—Samuel M. Heinrich

[57] ABSTRACT

A semiconductor chip (1) is bonded to a substrate (2) serving as a component housing, a contact part, an insulative part or a connecting part without the use of a high-temperature process or any additional bonding medium such as solder or flux. The backside of the semiconductor chip (1) or substrate (2) is structured to include specially formed bumps (3) for the necessary connections. A ductile metal is used for these bumps (3). The bond to the substrate (2) is formed by using pressure and/or ultrasonic energy. The process according to this invention is particularly suitable for bonding components in data link receivers, optoelectronic couplers, transmitters (LEDs, IREDs) and ISDN modules.

12 Claims, 1 Drawing Sheet

PROCESS FOR BONDING SEMICONDUCTOR CHIPS TO SUBSTRATES

CROSS-REFERENCE TO RELATED APPLICATION

This is a continuation of Ser. No. 07/400,259 filed Aug. 29, 1989, now abandoned.

BACKGROUND OF THE INVENTION

This invention relates to a technique for joining a semimiconductor chip to a substrate as a component carrier part, a contact part, an insulated part or a connecting part.

In the manufacture of various electronic or optoelectronic semiconductor components, it is usually necessary to connect a semiconductor chip to a substrate. The substrate as a component carrier may be made of a semiconductor material and may be structured in the form of a diode, a transistor or an integrated circuit. As a connecting part, the substrate may also have electrical conducting tracks or waveguide structures. In addition, the substrate may also be made of a dielectric material, e.g., a ceramic, and it can also provide insulative functions and carrier functions. Finally, the substrate may also serve as an electric or thermal contact part or connecting part for connecting to a voltage source or for establishing a thermal contact to a heat sink which may be necessary in some cases. For example, one such typical situation is when a laser diode must be connected to a Peltier cooling element.

With the conventional methods of bonding semiconductor chips to a substrate today, the semiconductor is either alloyed and soldered or is applied to the substrate by means of an adhesive so it is thermally or electrically conducting. However, these processes are expensive and complicated and can also have negative effects on the system carrier or chip. Thus, for example, the conducting tracks normally present on the semiconductor system chip may also become alloyed in such an alloying process due to the relatively high temperatures required, or existing pn junctions may be altered in a manner that has a negative effect due to diffusion processes taking place in a semiconductor chip that has already been produced (e.g., a silicon system chip).

This invention is based on the problem of developing a simple and inexpensive method of bonding a semiconductor chip to a substrate without requiring high temperatures or an additional bonding medium such as solder or flux.

SUMMARY OF THE INVENTION

In the process according to this invention the back of the semiconductor chip or the substrate is structured so that small peaks, or so-called bumps, are formed for the required contacts. These bumps comprise a ductile metal. Aluminum, silver or gold are especially suitable ductile metals. The bumps preferably have a diameter of 10 $\mu$m to 50 $\mu$m and a height of 5 $\mu$m to 40 $\mu$m. The connection to the substrate is established with pressure and ultrasound. The type of bonding technique used here is similar to the nailhead ball bonding technique used internationally today. It may be advantageous for the substrate to be preheated to temperatures of 180° C. to 300° C. (thermosonic process).

The process according to this invention can also be used for bonding integrated circuits when the bumps described here are applied to the pads or to a support provided with bumps.

With the process according to this invention, so-called "piggyback" arrangements may also be produced by a simple and relatively inexpensive method. With a "piggyback" diode arrangement for a bidirectional serial data exchange, for example a light-emitting diode is provided as the light emitter with a relatively small light exit angle beneath the surface of a larger photodiode in which a hole is provided for insertion of the optical fiber, and it is mounted in such a way that the main beam cone of the light emitted by the LED is located beneath the hole of the photodiode.

A special advantage of the process according to this invention is that piggyback hybrids can be produced very easily. Detectors in which a photodiode is hybridized with a preamplifier IC in a housing are required for modern communications transmissions employing optical fibers. The process proposed here permits direct connection of integrated circuits (IC) and photodiodes without requiring additional bond wires for the electric connection.

Low capacitance and low inductance preamplifiers which thus have very good transmission properties can be produced by the direct wireless bonding technique. Furthermore, the piggyback arrangement saves space so standard housings (TO housings) can be used.

Another application for the bonding technique proposed here is for use in optical semiconductor transmitters (LEDs and IREDs).

With semiconductor emitters which have the pn junction near the heat sink (upside down assembly) there is the danger of a short circuit with the traditional bonding technique due to the use of conductive adhesive or solder. With the proposed bump bonding technique, this danger is reliably eliminated. Furthermore, the emission characteristics of the semiconductor emitter are not impaired. Light absorption or scattering at the edges of the light emitting semiconductor components is prevented especially due to the fact that problem causing adhesive residues are avoided.

In comparison with the traditional bonding and contacting processes, an essential advantage of the process according to this invention is that the distance between the semiconductor chip and the substrate to be bonded is adjustable and thus can be controlled by appropriate formation of the bump structure.

BRIEF DESCRIPTION OF THE DRAWING

This invention will now be illustrated further with reference to a limited number of the many possible practical examples which are diagrammed in purely schematic form in the accompanying figures together with the description of a preferred illustrative embodiment of the invention. The figures show the following.

DETAILED DESCRIPTION

Figure 1:
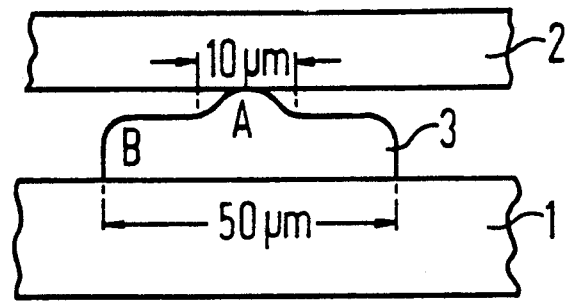
FIG. 1 demonstrates the shape of a bump that is especially suitable for bonding.

In the practical example illustrated in FIG. 1, the backside of the semiconductor chip 1 is structured so as to form bump 3 for the connection between chip 1 and substrate 2. The connection between semiconductor chip 1 and substrate 2 is produced by pressure and ultrasound. Bump 3 in this practical example includes of the smaller bump portion A with a diameter of about 10 μm and the larger bump portion B which is set off from the former and has a diameter of about 50 μm. The ratio of the smaller bump portion A to the larger bump portion B is preferably such that the bonding energy in the smaller bump portion A is converted in bonding and there is no fundamental change in the geometry of larger bump portion B which also functions as a spacer. Bumps A and B comprise a ductile metal suitable for bonding purposes.

Figure 2:
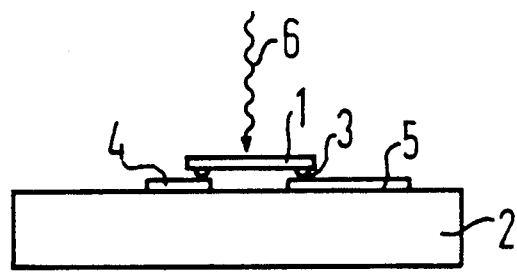
FIG. 2 shows a photodiode bonded to an IC by the process according to the present invention.

FIG. 2 shows the bonding of a photodiode as semiconductor chip 1 to an integrated semiconductor circuit as substrate 2 as a practical example. The wavy arrow 6 indicates the direction of incidence of light striking photodiode contained in chip 1. Bumps 3 which in this example are provided between the n-type contact (pad) 4 and the p-type contact (pad) 5 and the corresponding contact (not shown) of the photodiode chip 1 assure the required connection between semiconductor chip photodiode 1 and substrate (IC) 2.

Figure 3:
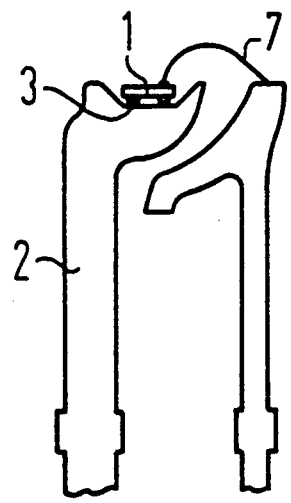
FIG. 3 illustrates an LED bonded to a conducting strip.

In the practical example illustrated in FIG. 3, a light emitting diode is connected as semiconductor chip 1 to a conducting strip as substrate 2 by way of bumps 3. The conducting track substrate 2 bonded to the LED chip 1 is preferably designed as a reflector and the second conducting track assures the required second contact with the LED by way of a bond wire 7.

Figure 4:
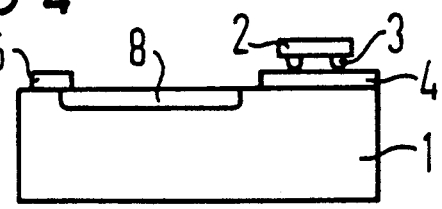
FIG. 4 shows the bonding of a photodiode to a preamplifier as another practical example of the process according to this invention.

FIG. 4 presents as another practical example of the process according to this invention the bonding of a photodiode as chip 1 to a pre-amplifier as substrate 2 by way of bumps 3. In this example the p-type contact 5 is connected to a p-type diffusion zone 8 of photodiode in chip 1. The bumps 3 leading to substrate 2 (pre-amplifier) are on the n-type contacts (pads) 4.

We claim:

1. A process for bonding a semiconductor chip to a substrate, comprising the steps of:
   forming a first bump of ductile metal having a first predetermined size on one of the semiconductor chip or substrate;
   forming a second bump of ductile metal on the first bump, the second bump having a second predetermined size smaller than the first predetermined size of the first bump; and
   bonding the semiconductor chip to the substrate by means of one or both of pressure and ultrasonic energy applied to the bumps;
   the first and second predetermined sizes being such that when bonding force is applied to the bumps, the geometry of the first bump is not affected significantly.

2. A process according to claim 1, wherein the ductile metal used for bumps is aluminum, silver or gold.

3. A process according to claim 1, wherein the diameter of bumps is 10 μm to 50 μm and the height of bumps is 5 μm to 40 μm.

4. A process according to claim 2, wherein the diameter of bumps is 10 μm to 50 μm and the height of bumps is 5 μm to 40 μm.

5. A process according to claim 1, wherein the substrate is preheated to temperatures of about 180° C. to 300° C.

6. A process according to claim 2, wherein the substrate is preheated to temperatures of about 180° C. to 300° C.

7. A process according to claim 3, wherein the substrate is preheated to temperatures of about 180° C to 300° C.

8. A process according to claim 4, wherein the substrate is preheated to temperatures of about 180° C. to 300° C.

9. A process according to claim 1, for bonding semiconductor chips, integrated semiconductor circuits, light-emitting diodes to photodiodes or a conducting track, a photodiode to a pre-amplifier, a laser diode to a heat sink or chip capacitors, and chip resistors.

10. A process according to claim 2, for bonding semiconductor chips, integrated semiconductor circuits, light-emitting diodes to photodiodes or a conducting track, a photodiode to a pre-amplifier, a laser diode to a heat sink or chip capacitors, and chip resistors.

11. A process according to claim 3, for bonding semiconductor chips, integrated semiconductor circuits, light-emitting diodes to photodiodes or a conducting track, a photodiode to a pre-amplifier, a laser diode to a heat sink or chip capacitors, and chip resistors.

12. A process according to claim 5, for bonding semiconductor chips, integrated semiconductor circuits, light-emitting diodes to photodiodes or a conducting track, a photodiode to a pre-amplifier, a laser diode to a heat sink or chip capacitors, and chip resistors.

* * * * *